US010265776B2

(12) United States Patent
Abe et al.

(10) Patent No.: US 10,265,776 B2
(45) Date of Patent: Apr. 23, 2019

(54) CUTTING TOOL

(71) Applicant: KOBE STEEL, LTD., Kobe-shi (JP)

(72) Inventors: Maiko Abe, Hyogo (JP); Kenji Yamamoto, Hyogo (JP)

(73) Assignee: Kobe Steel, Ltd., Kobe-shi (JP)

(*) Notice: Subject to any disclaimer, the term of this patent is extended or adjusted under 35 U.S.C. 154(b) by 163 days.

(21) Appl. No.: 15/303,301

(22) PCT Filed: Apr. 22, 2015

(86) PCT No.: PCT/JP2015/062311
§ 371 (c)(1),
(2) Date: Oct. 11, 2016

(87) PCT Pub. No.: WO2015/163387
PCT Pub. Date: Oct. 29, 2015

(65) Prior Publication Data
US 2017/0036274 A1 Feb. 9, 2017

(30) Foreign Application Priority Data

Apr. 25, 2014 (JP) .................................. 2014-091848

(51) Int. Cl.
B23B 27/14 (2006.01)
B23B 51/00 (2006.01)
B23C 5/16 (2006.01)
C23C 14/06 (2006.01)
C23C 28/04 (2006.01)

(52) U.S. Cl.
CPC ............ *B23B 27/148* (2013.01); *B23B 27/14* (2013.01); *B23B 51/00* (2013.01); *B23C 5/16* (2013.01); *C23C 14/0641* (2013.01); *C23C 28/044* (2013.01); *C23C 28/046* (2013.01); *B23B 2222/28* (2013.01); *B23B 2228/10* (2013.01); *C23C 14/06* (2013.01)

(58) Field of Classification Search
USPC .......... 51/307, 309; 428/156, 697, 698, 699, 428/701, 702; 407/118, 119
See application file for complete search history.

(56) References Cited

U.S. PATENT DOCUMENTS

| 4,966,501 | A | * | 10/1990 | Nomura | B23B 27/148 |
| | | | | | 428/698 |
| 2001/0003569 | A1 | * | 6/2001 | Ota | C04B 41/009 |
| | | | | | 407/118 |
| 2006/0127671 | A1 | * | 6/2006 | Park | C23C 4/12 |
| | | | | | 428/408 |
| 2006/0204757 | A1 | | 9/2006 | Ljungberg | |
| 2007/0253787 | A1 | | 11/2007 | Ishii | |
| 2014/0023740 | A1 | | 1/2014 | Kashi et al. | |

FOREIGN PATENT DOCUMENTS

| EP | 1348776 | * 10/2003 |
| JP | 07-157862 | * 6/1995 |
| JP | 2002-146515 | * 5/2002 |
| JP | 2006-231512 A | 9/2006 |
| JP | 2006-263857 A | 10/2006 |
| JP | 2007-313636 A | 12/2007 |
| JP | 2010-99735 A | 5/2010 |
| JP | 2011-183545 A | 9/2011 |
| JP | 2011-235414 A | 11/2011 |
| KR | 10-2013-0122971 A | 11/2013 |

OTHER PUBLICATIONS

International Search Report dated Jun. 16, 2015 in PCT/JP2015/062311 (with English translation).
Written Opinion dated Jun. 16, 2015 in PCT/JP2015/062311 (with English translation).

* cited by examiner

*Primary Examiner* — Archene A Turner
(74) *Attorney, Agent, or Firm* — Oblon, McClelland, Maier & Neustadt, L.L.P.

(57) ABSTRACT

A cutting tool has a substrate. A surface of the substrate for the cutting tool is covered with a hard film. In the cutting tool, the hard film has a root-mean-square slope RΔq in a surface of the hard film of 0.060° or less.

16 Claims, No Drawings

CUTTING TOOL

TECHNICAL FIELD

The present invention relates to a cutting tool.

BACKGROUND ART

Conventionally, coating with a hard film of TiN, TiCN, TiAlN, etc. has been performed for the purpose of enhancing the wear resistance of a jig using a cemented carbide, a cermet, a high-speed tool steel, an alloy tool steel, etc. as the substrate.

In recent years, accompanying an increase in the hardness of a work material and a speedup of the cutting rate, a hard film having more enhanced wear resistance is required. Therefore, it is also attempted to apply, as a hard film, a nitride or an oxide each containing at least any one element of Ti, Cr and Al. This hard film has high hardness and excellent oxidation resistance and therefore, is used as a wear-resistant film by being made to coat a surface of a cutting tool, a forming tool or a machine component.

However, such a hard film exhibits a high friction coefficient with various work materials and suffers from the defect of readily causing seizure (so-called "galling") in a sliding environment. This defect is caused similarly in an environment using a wet lubricant.

A technique for achieving enhancement of the wear resistance by focusing attention not on the material of the hard film but on the surface profile thereof has been proposed. As regards such a technique, for example, Patent Document 1 has proposed a technique of smoothing the hard film surface to an arithmetic mean roughness Ra of 0.05 μm or less so as to decrease a surface defect, improve the galling resistance and oxidation resistance, and thereby enhance the wear resistance. Owing to this technique, it is expected also in the cutting tool field to enhance the wear resistance similarly by the surface profile. However, the effect of improving the wear resistance only by controlling the arithmetic mean roughness Ra to 0.05 μm or less is insufficient in fact.

In particular, for enabling high-speed cutting of, as a work material, a high-hardness member such as cast iron, a cutting tool having more improved wear resistance than ever before must be realized.

PRIOR ART LITERATURE

Patent Document

Patent Document 1: JP-A-2010-99735

SUMMARY OF THE INVENTION

Problems that the Invention is to Solve

The present invention has been made under these circumstances, and an object thereof is to provide a cutting tool in which wear resistance is further enhanced by devising the surface profile of a hard film and which is, even when a high-hardness member such as cast iron is a work material, useful for high-speed cutting it.

Means for Solving the Problems

The cutting tool of the present invention capable of solving the above-described problems is a cutting tool having a substrate of which a surface is covered with a hard film, in which the hard film has a root-mean-square slope RΔq in a surface thereof of 0.060° or less.

In the cutting tool of the present invention, it is preferable that the hard film has an arithmetic mean roughness Ra in the surface thereof of 0.030 μm or more and 0.30 μm or less. It is also preferable that the hard film has a maximum height roughness Rz in the surface thereof of 0.20 μm or more and 3.5 μm or less.

The substrate used for the cutting tool of the present invention includes any one of a tungsten carbide-based cemented carbide, a cermet alloy, a high-speed tool steel, and an alloy tool steel. As the hard film, preferable examples include a nitride, a carbonitride and an oxide each containing at least any one element of Ti, Cr and Al.

Advantage of the Invention

According to the present invention, the root-mean-square slope RΔq in the hard film surface is 0.060° or less, whereby a cutting tool with more improved wear resistance can be realized.

MODE FOR CARRYING OUT THE INVENTION

The present inventors have studied on the relationship between the shape of the hard film surface and the wear resistance. Heretofore, as to the effect of the surface profile of the hard film on the wear resistance, parameters in the height direction (for example, the above-described arithmetic mean roughness Ra) have been considered to impose a large effect. However, the studies of the present inventors have revealed that the slope of a projection present in the hard film surface has a larger effect on the wear resistance than the parameters in the height direction.

The cutting tool of the present invention is characterized in that the root-mean-square slope RΔq in the hard film surface is 0.060° or less. As described in JIS B0601 (2013), the root-mean-square slope RΔq is one specifying the slope of a projection in a roughness curve (contour curve) of the hard film surface.

If the value of the root-mean-square slope RΔq becomes large, the frictional force generated in a direction parallel to the surface is increased and at the same time, adhesion is likely to be produced to readily damage the film. By making the value of the root-mean-square slope RΔq small, the cutting resistance can be decreased to suppress flank wear and attempt to enhance the wear resistance. The root-mean-square slope RΔq must be 0.060° or less so as to bring out the effect above. The root-mean-square slope RΔq is preferably 0.020° or less and more preferably 0.010° or less. In consideration of productivity, etc., the lower limit of the root-mean-square slope RΔq is about 0.001° or more. The definition and measurement method of the root-mean-square slope RΔq are based on JIS B 0601 (2013).

In order to more bring out the function of the hard film, it is also useful to appropriately control the surface profile parameters in the height direction. For this reason, controlling the arithmetic mean roughness Ra (JIS B 0601 (2013)) in the hard film surface (contour curve) is also effective for reducing the wear volume of the tool. From this viewpoint, the arithmetic mean roughness Ra in the hard film surface is preferably 0.30 μm or less and more preferably 0.25 μm or less. However, if the arithmetic mean roughness Ra in the hard film surface is too small, the contact area with a work material is increased, and thereby friction during cutting is increased to readily allow for the progress of wear. From this viewpoint, the arithmetic mean roughness Ra is preferably 0.030 µm or more and more preferably 0.050 µm or more. The definition and measurement method of the arithmetic mean roughness Ra are based on JIS B0601 (2013).

From a similar viewpoint as in controlling the arithmetic mean roughness Ra, controlling the maximum height roughness Rz (JIS B 0601 (2013)) in the hard film surface (contour curve) is also effective for reducing the wear volume of the tool. From a similar viewpoint as in specifying the arithmetic mean roughness Ra in the hard film surface, the maximum height roughness Rz is preferably 3.5 µm or less and more preferably 2.0 µm or less. However, if the maximum height roughness Rz in the hard film surface is too small, the contact area with a work material is increased, and thereby friction during cutting is increased to readily allow for the progress of wear. From this viewpoint, the maximum height roughness Rz is preferably 0.20 µm or more and more preferably 0.50 µm or more. The definition and measurement method of the maximum height roughness Rz are based on JIS B 0601 (2013).

The substrate on which the hard film is formed includes a tungsten carbide-based cemented carbide such as, for example, WC—Co-based alloy, WC—TiC—Co-based alloy, WC—TiC—TaC(NbC)—Co-based alloy, and WC—TaC(NbC)—Co-based alloy; a cermet alloy such as, for example, TiC—Ni—Mo-based alloy and TiC—TiN—Ni—Mo-based alloy, a high-speed tool steel such as, for example, SKS51 and SKD61 specified in JIS G 4403 (2006); and an alloy tool steel such as, for example, SKS11 and SKD1 specified in JIS G 4404 (2006).

The kind of the hard film for use in the present invention is not particularly limited and may be a conventionally known hard film, in brief, may be sufficient if the surface profile thereof satisfies the above-described requirements. The hard film preferred in view of wear resistance includes, for example, one composed of a nitride, a carbonitride or an oxide each containing at least any one element of Ti, Cr and Al. Specifically, AlTiN, TiCrAlN, TiCrAlCN, TiCrAlO, AlCrN, $Al_2O_3$, etc., are effective as a hard film excellent in the wear resistance and high temperature-resistant lubricity.

The hard film may be formed as a single layer but, if desired, may be either a film where two or more films having the same constituent elements but differing in the composition are laminated, or a film where two or more films differing in the constituent elements are laminated.

The thickness of the hard film (in the case of the laminated films above, the total thickness) varies depending on use but is preferably about 0.5 µm or more and 20 µm or less. If the thickness (film thickness) is less than 0.5 µm, it is difficult that the wear resistance can be sufficiently exerted because it is too thin. On the other hand, if the film thickness exceeds 20 µm, chipping or separation of the film readily occurs during cutting. The film thickness is more preferably 1 µm or more and still more preferably 2 µm or more. The upper limit of the film thickness is more preferably 15 µm or less and still more preferably 10 µm or less.

The hard film can be made to cover the substrate surface by using a known method such as physical vapor deposition process (PVD process) and chemical vapor deposition process (CVD process). Of these methods, in view of the adhesiveness, etc. of the hard film to the substrate, production using a PVD process is preferred. Specifically, a reactive PVD process such as ion plating process, for example, an arc ion plating (AIP) process of evaporating or ionizing a target used as a solid evaporation source to deposit on a to-be-treated body (substrate) in a gas containing nitrogen, hydrocarbon or oxygen, and sputtering process is effective.

In the deposition by an arc ion plating process, preferable conditions include, for example, the following conditions.
 Total pressure: 0.5 Pa or more and 4 Pa or less
 Impressed current (discharge current): 100 to 200 A
 Substrate temperature during deposition: 300° C. or more and 800° C. or less For adjusting the root-mean-square slope RΔq to an appropriate range, the surface of the hard film formed as above or the surface of the substrate before forming the hard film thereon may be polished by use of a projection type polishing apparatus while controlling, e.g., the projection pressure, the projection time and the projection direction of the projection material. For example, when the projection pressure is elevated or the projection time is extended while controlling the projection direction of the projection material, the root-mean-square slope RΔq can be made small.

For adjusting the arithmetic mean roughness Ra and the maximum height roughness Rz to appropriate ranges, similar to the case in adjusting the root-mean-square slope RΔq, a projection type polishing apparatus may be used to the surface of the hard film formed as above and the projection pressure, the projection time, the projection direction of the projection material, and the like may be controlled. The surface roughness can also be controlled by controlling the particle diameter of the projection material. For example, when the particle diameter of the projection material is large, the arithmetic mean roughness Ra or the maximum height roughness Rz tends to be increased.

The cutting tool of the present invention exerts excellent wear resistance and is useful particularly as a cutting tool for high-speed turning in a wet environment.

EXAMPLES

The present invention is described more specifically below by referring to Examples, but the present invention is not limited by these Examples and can be of course implemented by appropriately adding changes as long as the gist described above and below can be observed, and these changes all are included in the technical scope of the present invention.

Films having the composition and structure shown in Table 1 below were formed with an AIP apparatus having a plurality of evaporation sources. Here, two kinds of inserts for cutting, SNGA120408 and SNMA120408 (manufactured by Mitsubishi Materials Corporation, tip for cutting made of cemented carbide), and a specimen, which has been mirror-finished, made of cemented carbide (13 mm×13 mm×5 mm thickness) for surface roughness examination were used as the substrate.

TABLE 1

| Test No. | Kind of Hard Film | Substrate |
| --- | --- | --- |
| 1 | AlTiN | SNGA120408 |
| 2 | | |
| 3 | | |
| 4 | | |
| 5 | | |
| 6 | | SNMA120408 |
| 7 | | |
| 8 | | |
| 9 | | |
| 10 | | |
| 11 | AlTiN + TiCrAlN | |
| 12 | TiCrAlO | |

Each of these substrates was ultrasonically degreased and cleaned in ethanol and introduced into an AIP apparatus. The pressure in the apparatus was evacuated until reaching $5\times10^{-3}$ Pa. Subsequently, the substrate was heated to 500° C., followed by conducting etching by Ar ion for 5 minutes. Thereafter, a nitrogen gas or an oxygen gas was introduced up to 4 Pa and by operating the arc evaporation source (target diameter: 100 mm) at a discharge current of 150 A, each of an AlTiN film, a laminated film of AlTiN (substrate side)+TiCrAlN (surface side), and a TiCrAlO film was formed in a thickness of about 10 μm on the substrate, whereby cutting tools were obtained.

After deposition on the flank of the substrate and a polishing treatment performed to control the surface profile, the measurement of surface parameters was conducted by the following method, and the wear resistance was measured. In the polishing treatment, a projection type polishing apparatus was used, and the surface profile was controlled by controlling, e.g., the projection pressure, the projection time, and the particle diameter or projection direction of the projection material.

(Measurement of Surface Parameters)

With respect to each of the obtained cutting tools (Test Nos. 1 to 12), the measurement of surface parameters was conducted by using a stylus type surface roughness meter (DekTak 6M) and using the cemented carbide-made specimen for surface roughness examination. In this measurement, by setting the scan length to 1 mm and the number of measurement points in the horizontal direction to 3, the root-mean-square slope RΔq, the arithmetic mean roughness Ra and the maximum height roughness Rz were calculated in conformity with JIS B 0601 (2013) from a roughness curve obtained by removing a waviness component from the measured surface curve. These were measured at arbitrary 3 points on the surface, and an average value thereof was employed.

(Measurement of Wear Resistance)

The wear resistance was evaluated by performing a cutting test under the following conditions by using samples (Test Nos. 1 to 12) in which a deposition is performed on the cemented carbide-made tips for cutting above, and thereby measuring the flank wear width. As a specific standard, samples where the flank wear width is 300 μm or less were judged to be excellent in the wear resistance. The flank wear width is preferably less than 300 μm, more preferably 250 μm or less, still more preferably 200 μm or less, and yet still more preferably 100 μm or less.

(Cutting Test Conditions)

Work material: FCP500 (spheroidal graphite cast iron product: JIS G 5502 (2001)): a material in a state before being heat-treated (untreated material)

Cutting speed: 300 m/min

Feed: 0.25 mm/revolution

Depth of cut: 2 mm

Lubrication: wet (emulsion)

Cutting time: 6 minutes

Evaluation condition: evaluated by flank wear width

The results (surface profile, flank wear width) are shown in Table 2 below. These results are ones in which the effect of the surface profile on the cutting performance was examined by fixing the hard film thickness to 10 μm and forming films differing in the composition.

TABLE 2

| Test No. | Surface Parameters | | | Flank Wear |
|---|---|---|---|---|
| | Ra (μm) | Rz (μm) | RΔq (°) | Width (μm) |
| 1 | 0.070 | 1.090 | 0.0624 | 303 |
| 2 | 0.044 | 0.771 | 0.0278 | 210 |
| 3 | 0.042 | 0.358 | 0.0145 | 135 |
| 4 | 0.035 | 0.244 | 0.0084 | 80 |
| 5 | 0.025 | 0.175 | 0.0073 | 300 |
| 6 | 0.275 | 2.880 | 0.0972 | 303 |
| 7 | 0.345 | 3.600 | 0.0480 | 300 |
| 8 | 0.255 | 2.030 | 0.0488 | 235 |
| 9 | 0.216 | 1.850 | 0.0300 | 165 |
| 10 | 0.245 | 1.750 | 0.0150 | 115 |
| 11 | 0.232 | 2.870 | 0.0450 | 195 |
| 12 | 0.205 | 2.387 | 0.0531 | 170 |

These results can lead to the following discussions. It is understood that in Test Nos. 2 to 4 and 8 to 12, since the surface parameters (Ra, Rz, RΔq) satisfy the ranges specified in the present invention and the preferable ranges, good wear resistance is exerted.

Test No. 5 is an example where the root-mean-square slope RΔq falls in the range specified in the present invention to thereby provide good wear resistance (flank wear width is 300 μm) but the arithmetic mean roughness Ra and the maximum height roughness Rz are smaller than the preferable lower limits. Test No. 7 is an example where the root-mean-square slope RΔq falls in the range specified in the present invention to thereby provide good wear resistance (flank wear width is 300 μm) but the arithmetic mean roughness Ra and the maximum height roughness Rz are larger than the preferable upper limits.

Comparison of Test No. 5 and Test No. 7 with Test Nos. 2 to 4 and 8 to 12 teaches that the arithmetic mean roughness Ra and the maximum height roughness Rz are preferably in the recommended ranges so as to more reduce the flank wear width.

On the other hand, in Test Nos. 1 and 6 where the root-mean-square slope RΔq in the hard film surface exceeds 0.060°, the flank wear width is increased. In particular, even when the arithmetic mean roughness Ra and the maximum height roughness Rz satisfy the preferable ranges, if the root-mean-square slope RΔq departs from the range specified in the present invention, the wear resistance is deteriorated.

It is understood from the results of Test Nos. 1 to 12 that irrespective of the film composition, when the surface profile specified in the present invention is satisfied, excellent wear resistance can be ensured.

The present application is based on Japanese Patent Application (Patent Application No. 2014-91848) filed on Apr. 25, 2014, and the contents thereof are incorporated herein by reference.

The invention claimed is:

1. A cutting tool comprising a substrate, wherein a surface of the substrate is covered with a hard film, wherein the hard film has a root-mean-square slope RΔq in a surface thereof of 0.060° or less, wherein the substrate comprises a cemented carbide comprising tungsten carbide, a cermet alloy, a high-speed tool steel, or an alloy tool steel.

2. The cutting tool of claim 1, wherein the hard film has an arithmetic mean roughness Ra in the surface thereof of 0.030 μm or more and 0.30 μm or less.

3. The cutting tool of claim 2, wherein the hard film has a maximum height roughness Rz in the surface thereof of 0.20 μm or more and 3.5 μm or less.

4. The cutting tool of claim 3, wherein the hard film comprises a nitride, a carbonitride or an oxide, each comprising at least one element selected from the group consisting of Ti, Cr and Al.

5. The cutting tool of claim 2, wherein the hard film comprises a nitride, a carbonitride or an oxide, each comprising at least one element selected from the group consisting of Ti, Cr and Al.

6. The cutting tool of claim 1, wherein the hard film has a maximum height roughness Rz in the surface thereof of 0.20 μm or more and 3.5 μm or less.

7. The cutting tool of claim 6, wherein the hard film comprises a nitride, a carbonitride or an oxide, each comprising at least one element selected from the group consisting of Ti, Cr and Al.

8. The cutting tool of claim 1, wherein the substrate comprises a cemented carbide comprising tungsten carbide.

9. The cutting tool of claim 8, wherein the hard film comprises a nitride, a carbonitride or an oxide, each comprising at least one element selected from the group consisting of Ti, Cr and Al.

10. The cutting tool of claim 1, wherein the substrate comprises a cermet alloy.

11. The cutting tool of claim 10, wherein the hard film comprises a nitride, a carbonitride or an oxide, each comprising at least one element selected from the group consisting of Ti, Cr and Al.

12. The cutting tool of claim 1, wherein the hard film comprises a nitride, a carbonitride or an oxide, each comprising at least one element selected from the group consisting of Ti, Cr and Al.

13. The cutting tool of claim 1, wherein the substrate comprises a high-speed tool steel.

14. The cutting tool of claim 13, wherein the hard film comprises a nitride, a carbonitride or an oxide, each comprising at least one element selected from the group consisting of Ti, Cr and Al.

15. The cutting tool of claim 1, wherein the substrate comprises an alloy tool steel.

16. The cutting tool of claim 15, wherein the hard film comprises a nitride, a carbonitride or an oxide, each comprising at least one element selected from the group consisting of Ti, Cr and Al.

* * * * *